(12) United States Patent
Angelo et al.

(10) Patent No.: US 6,235,163 B1
(45) Date of Patent: May 22, 2001

(54) METHODS AND APPARATUS FOR IONIZED METAL PLASMA COPPER DEPOSITION WITH ENHANCED IN-FILM PARTICLE PERFORMANCE

(75) Inventors: Darryl Angelo, Sunnyvale; Arvind Sundarrajan, Santa Clara; Peijun Ding, San Jose; James H. Tsung, San Jose; Ilyoung R. Hong, San Jose; Barry Chin, Saratoga, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/350,556

(22) Filed: Jul. 9, 1999

(51) Int. Cl.⁷ .................................................. C23C 14/34
(52) U.S. Cl. ................ 204/192.12; 204/298.06; 204/298.09
(58) Field of Search .................. 204/192.12, 298.06, 204/298.09; 427/569

(56) References Cited

U.S. PATENT DOCUMENTS

| | | | | |
|---|---|---|---|---|
| 4,999,096 | * | 3/1991 | Nihei et al. | 204/192.3 |
| 5,178,739 | * | 1/1993 | Barnes et al. | 204/192.12 |
| 5,961,793 | * | 10/1999 | Ngan | 204/192.12 |
| 6,077,402 | * | 6/2000 | Hong et al. | 204/192.12 |
| 6,168,696 | * | 1/2001 | Burton et al. | 204/298.06 |

\* cited by examiner

Primary Examiner—Nam Nguyen
Assistant Examiner—Steven H. Ver Steeg
(74) Attorney, Agent, or Firm—Thomason, Moser & Patterson, LLP

(57) ABSTRACT

An improved system for performing plasma enhanced PVD of copper, aluminum, tungsten or other metallic material is disclosed. The system has markedly improved performance in the critical area of unwanted in-film particle deposits. The improved performance is provided by lowering the operating temperature of the RF coil used in the plasma enhanced PVD system and by carefully smoothing the outer surface of the RF coil. High conductivity material in the coil supports, increased contact area between the coil supports and the RF coil, and the use of active cooling of the coil further enhance the performance of the system.

14 Claims, 4 Drawing Sheets

METHODS AND APPARATUS FOR IONIZED METAL PLASMA COPPER DEPOSITION WITH ENHANCED IN-FILM PARTICLE PERFORMANCE

BACKGROUND OF THE INVENTION

1. Field of the Invention

This invention relates generally to methods and apparatus for fabricating electronic devices on substrates, including integrated circuits. More particularly, the invention relates to methods and apparatus for enhancing the in-film particle performances of a copper (Cu) layer deposited on a substrate using the Ionized Metal Plasma (IMP) enhanced Physical Vapor Deposition (PVD) system and technique.

2. Background of the Related Art

In the manufacture of semiconductor devices, conductive metal contacts and interconnect lines are deposited over dielectric layers such as silicon oxide. The down sizing of circuits to speed them up has led to the preference of copper (Cu) over the previously preferred aluminum conductors of prior art devices. Copper, however, can diffuse into the lattice structure of silicon and silicon oxide substrates if applied directly to its surface. This copper diffusion can rapidly alter device performance characteristics and can also cause device leakage. Prior to copper deposition, therefore, it has been found preferable to deposit a very thin conformal layer of tantalum (Ta) or tantalum nitride (TaN) onto the substrate. This layer acts as a diffusion barrier to prevent copper diffusion into a silicon or silicon oxide substrate material.

When the substrate surface has been prepared for copper deposition, copper is deposited thereon. A preferred technique, even used as a precursor step to later copper deposition by electroplating rather than vacuum deposition, has been to form the initial or "seed" copper (Cu) conductor layer on the substrate by use of a plasma enhanced physical vapor deposition process.

In conventional physical vapor deposition (PVD), a processing chamber is typically operated at a pressure of 1–10 millitorr using an inert gas such as argon (or a mixture of gases). A target of the material to be deposited (or sputtered) such as copper, is connected to a source of DC power. The substrate being processed is mounted on a support member spaced from and generally parallel to the target. A glow discharge plasma is struck in the processing gas by the application of DC power, and the positive argon ions are attracted to the negatively charged target. Atoms of the target material are knocked loose or sputtered from the target due to the impact momentum of the impinging argon ion and its interaction with the target material structure or lattice. The particles of material sputtered from the target are generally neutral atoms or molecules. These particles are directed in a plurality of angles from the target surface, following a distribution of directions which varies as the cosine of the angle from the particle trajectory to an angle normal to the target surface. In fact, very few atoms are sputtered directly vertically or normal from the target surface.

In order to provide a more diverse or controllable angle of impingement of the sputtered particles from the target onto the substrate surface, it has been found desirable to ionize the metallic atoms or molecules prior to their impingement on the substrate. By providing metallic ions having a net positive charge, selected portions or the whole surface of the substrate being processed may have a negative bias supplied to it. The negative electric field of the substrate bias can affect the trajectory, and hence the angle of impingement, of the ionized metallic atoms onto the substrate surface. This directionality can be used to advantage in PVD processes wherein high aspect ratio (ratio of depth to width) vias or trenches are to be deposited. Without the use of ionized metallic particles, the almost omnidirectional neutral sputtered particles (i.e. having an almost isotropic trajectory distribution) can cause a build up of target material on the top portion and upper side-walls of high aspect ratio features on the substrate. This causes even fewer atoms to be deposited on the bottom surface and lower side-walls of such features, as the aspect ratio is actually increased. Eventually deposited material on the top and upper side-walls can bridge over and connect forming an undesirable void inside the feature. In addition, the deposited material can also provide a source of metallic flakes or loose metal particles as contaminates that can affect device characteristics in later processing steps of the substrate.

Metallic flakes or loose contaminant particles in the processing chamber are free to move about. During subsequent deposition processes in the substrate processing in the chamber such moveable particles can become attracted to and settle on the surface of the substrate. This can alter device characteristics and cause undesired leakage to occur across insulator boundaries. This results in circuit failures in the completed device being fabricated.

In order to provide ionization of the neutral sputtered metallic particles between the target and the substrate, a higher density of background gas at pressures in the range of about 10 to about 60 millitorr is used in the PVD processing chamber. Also, an RF (radio frequency) coil is placed in the chamber between the target surface and the substrate surface. The axis of the RF coil is placed generally perpendicular to the target surface and the substrate surface. The diameter of the RF coil is chosen so that it closely approaches that of the inside diameter of the processing cavity. The RF coil is connected to a source of RF power which, when so applied, causes ionization of the argon background gas. The neutral metallic particles passing through the RF coil interior between the target and the substrate interact with the RF field and the ionized background gas and become ionized. If the pressure in the chamber is fairly high, for example about 30 millitorr, the RF coil provides a high density plasma in the region between the target and the substrate surface. This PVD deposition apparatus and process enhanced by the use of higher pressure background gas and the RF coil is known as an ionized metal plasma (IMP) chamber and process.

The use of IMP-Cu apparatus and process to form a seed layer for subsequent electroplating processes for copper (Cu) deposition has been accepted by the semiconductor industry. One of the most difficult problems in using the IMP-Metal Deposition apparatus and process has been the in-film particle (or defect) performance of the process. Loose particles can be generated as previously described, or by other, more subtle, processes. For example sharply spiked metallic points on a coil surface can cause the temporary formation of very high electric fields (corona effect). Such fields can attract loose particles or cause ionized metal particles to be attracted from the plasma in the RF coil to the surface of the coil. Because of the transient nature of these high electric fields, such particles deposited on such sites are only loosely bound thereto and can later flake off. Heretofore, the in-film particle numbers (or adders) of greater than 80 per substrate have been measured wherein the adders are >0.2 micrometers in diameter. It would be extremely valuable to provide an improved IMP-Cu apparatus and process which could significantly improve the in-film defects performance of the system.

SUMMARY OF THE INVENTION

The present invention generally provides methods and apparatus for operating an improved metallic particle deposition system such as an IMP-Cu physical vapor deposition (PVD) system which greatly enhances the in-film particle performance of the system. In the system and methods of the present invention, an IMP-Cu chamber is provided having an extremely smooth surface RF coil compared to the RF coil surfaces used previously in such systems. Moreover, in the improved apparatus and methods of the present invention, the temperature of the RF coil is maintained at a much lower value than the temperature of RF coils used in prior systems. The higher coil temperature provides a more hostile environment for the plating out of metallic particles on the coil. A cooler coil temperature may be achieved by a reduction in the RF power source duty cycle or by active cooling of the RF coil by circulating coolant through the interior of the coil, herein referred to as a coil cooling system. It has been discovered that the present invention lowers the in-film defects (adders) in a deposited Cu film by a factor of from about 2:1 to a factor of over 10:1 depending upon the operational parameters of the system.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

A preferred embodiment will be described below in reference to a copper deposition chamber and process. However, it is to be understood that other coil materials and deposition processes can benefit from the invention as well.

In IMP-Cu processing, a single turn RF made of copper (Cu) is used having the desired size and impedance characteristics. In titanium (Ti) deposition, a Ti coil could be used, in tantalum (Ta) deposition, a Ta coil could be used, and in tungsten (W) deposition, a W coil could be used. A careful and close inspection of the typical surface of a copper (Cu) coil (shown in FIG. 3) used in IMP-Cu processing reveals a knurled surface having a relatively large number of sharply spiked pin points on its surface. These pin points n result in particle generation which can compromise the integrity of the process or devices formed using the process.

Figure 1:
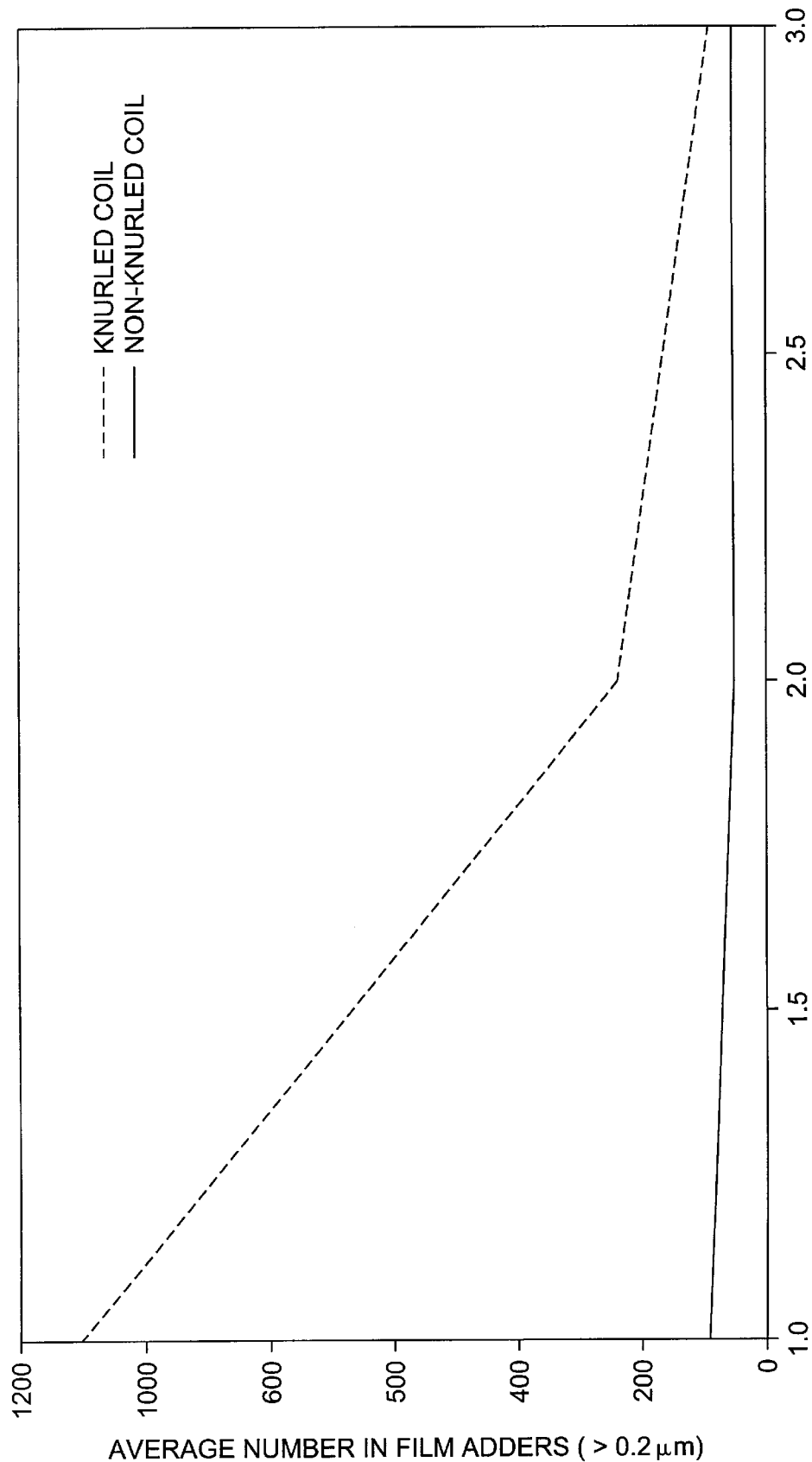
FIG. 1 is a graphical representation of data showing the average number of in-film defects (adders) >0.2 micrometers in size as a function of the temperature as determined by RF duty cycle for two different surface types of RF coils used in an IMP processing chamber.

Recognition of possible particle generation led to the postulation that the surface characteristics of the RF coil (knurled, knobby, smooth, or very smooth) could cause the generation of the in-film adders produced by the IMP-Cu process. It was also postulated that high RF coil temperature could cause generation of the observed Cu adders >0.2 micrometers. To determine the accuracy of these postulates, an experiment was run using a knurled surface coil and a smooth surface coil. FIG. 1 is a graphical representation of the results of this experiment.

In FIG. 1, the coil temperature is expressed as a function of the duty cycle of the RF power supplied to the coil. Duty cycle is defined as the ratio of time the RF coil is off (no power delivered to the coil) to the time the coil is on (RF power delivered to the coil). Thus, higher duty cycle ratios correspond to lower coil temperatures. In the experiment whose results are depicted in FIG. 1, three RF power supply duty cycles were tested 1:1 (highest temperature) 2:1 and 3:1 (lowest temperature). In the results depicted in FIG. 1, two RF coils were tested, one having a knurled surface (rough) and one having a smooth, polished surface. FIG. 1 illustrates that the smooth polished surface coil generates much fewer in-film particles than the knurled surface coil for all RF duty cycles. It is also believed that in the case of both coils, lower coil temperatures produce fewer in-film adders on the substrate. Based on these results, an improved IMP-metallic process and system such as for the IMP-Cu processing chamber system according to the concepts of the invention are shown schematically in sectional view in FIG. 2.

Figure 2:
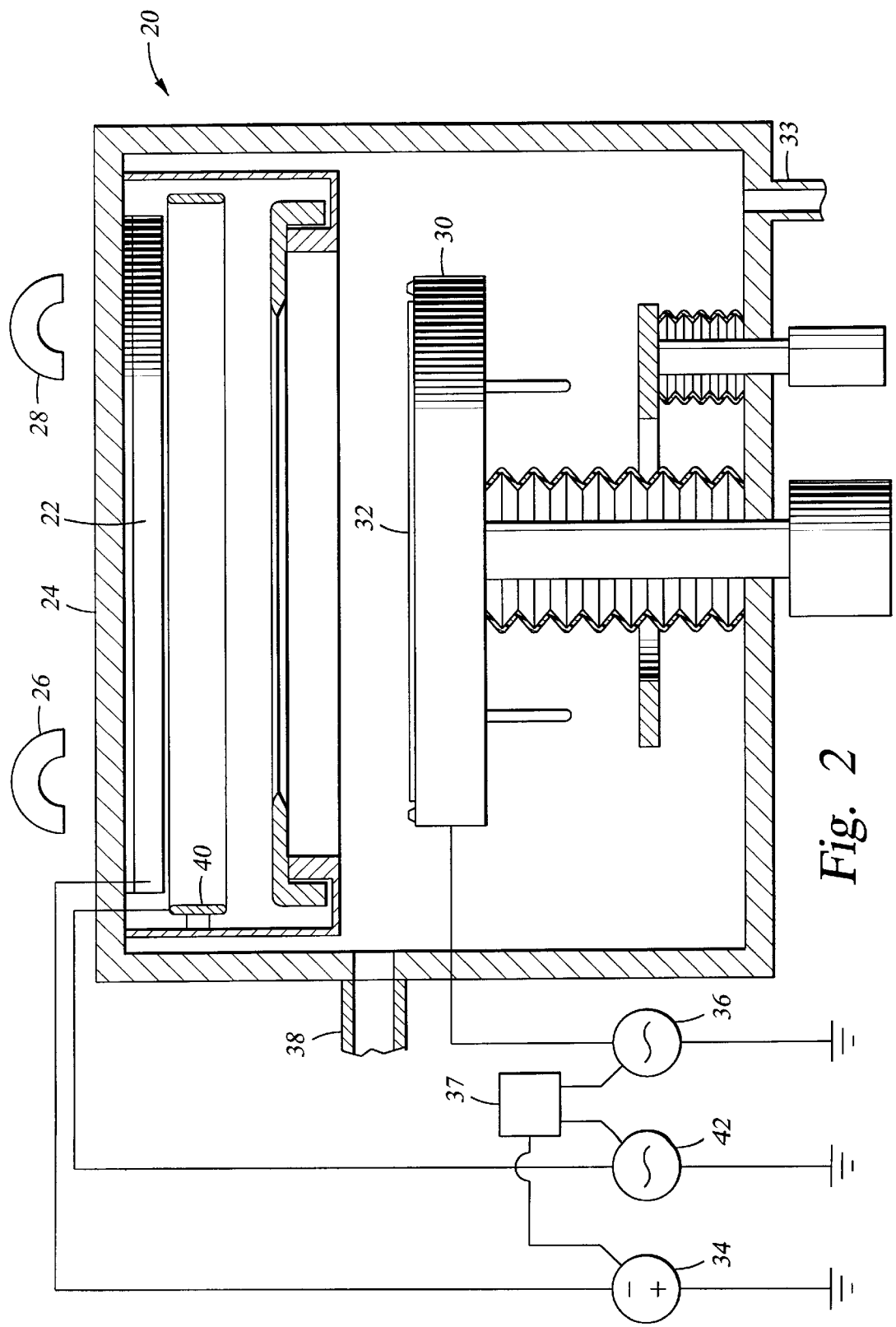
FIG. 2 is a schematic cross sectional view of an IMP chamber and system according to the invention.

Referring now to FIG. 2, an IMP-Cu chamber 20 of the present invention is shown. The chamber 20 has a Cu target 22 mounted on the lid 24 of chamber 20. A pair of opposing magnets 26, 28 are disposed on the lid of the chamber 20 and can be rotated by a rotational device (not shown). A substrate support 30 has a substrate 32 disposed on its upper surface and is placed parallel to and opposite target 22. A DC power source 34 is connected to the target 22. An RF power source 36 is connected to the substrate support 30. These two power sources provide the proper polarity bias, typically negative, to the target and the substrate support 30 and hence to the substrate .

Gas inlet 38 supplies a background gas flow (such as argon or a gas mixture) into the chamber 20. Gas sources may be connected to the gas inlet 38 via flow line and valves which are adjustable and are controlled by a controller 37. A gas outlet 33 can be opened and closed with valves (not shown) controlled by the controller 37 to provide an exhaust for the valves. The controller 37 can be any general purpose digital computer having a central processing unit, memory and being programmed to operate the gas valves, the vacuum pumping system and vacuum pump valve, the RF power supply 36, the DC power supply 34 and the RF power source 42.

The RF coil 40 has a smooth outer surface and can even be a polished surface. The coil surface may be prepared by first machine polishing and then by further chemical polishing and/or etching. The outer surface of the coil 40 is thus rendered free of any sharp protrusions which could contribute to the formation of loose flakes or adders which could be deposited on the substrate 32 in the IMP-Cu process.

The RF coil 40 is mounted inside the chamber 20 between the target 22 and the substrate support 30. Provided that the background gas pressure is maintained at about 30 millitorr, the RF coil 40 when excited by the RF power source 42 under control of the computer, operates to provide a high density plasma in the coil's interior region for the IMP-Cu process. RF power source 42 has its duty cycle controlled by the controller 37. By varying the RF power source 42 duty cycle, the highly polished outer surface coil 40 may be maintained at an optimum temperature to achieve minimum loose particle generation by the coil. It will also be appreciated by those of skill in the art that other coil temperature controls could be employed which would still fall within the scope of the present invention.

Figure 3:
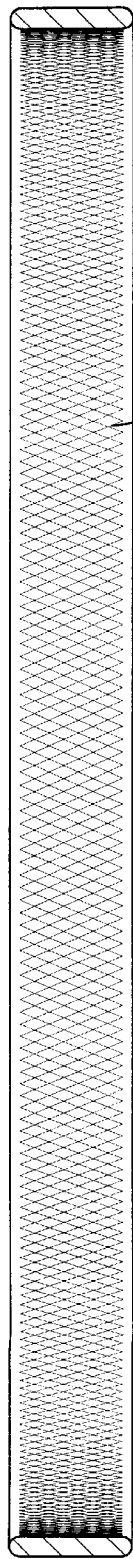
FIG. 3 is a sectional perspective view of a knurled coil.
Figure 4:
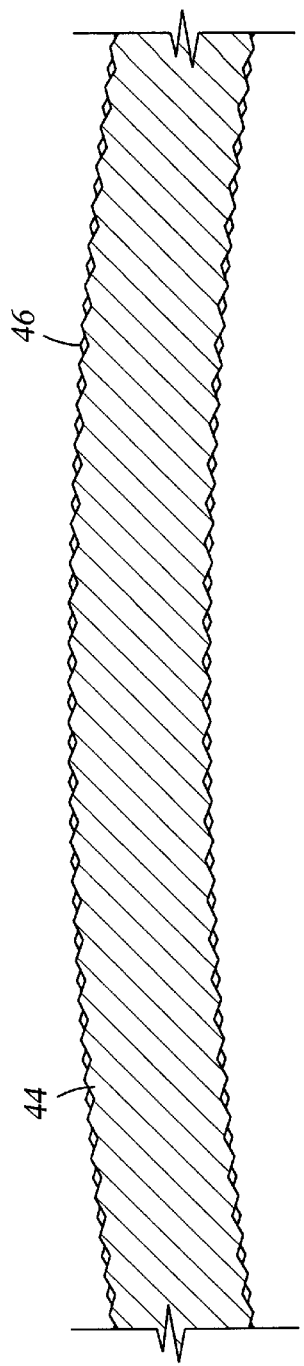
FIG. 4 is a schematic sectional view of a coil having a knurled or roughened surface.
Figure 5:
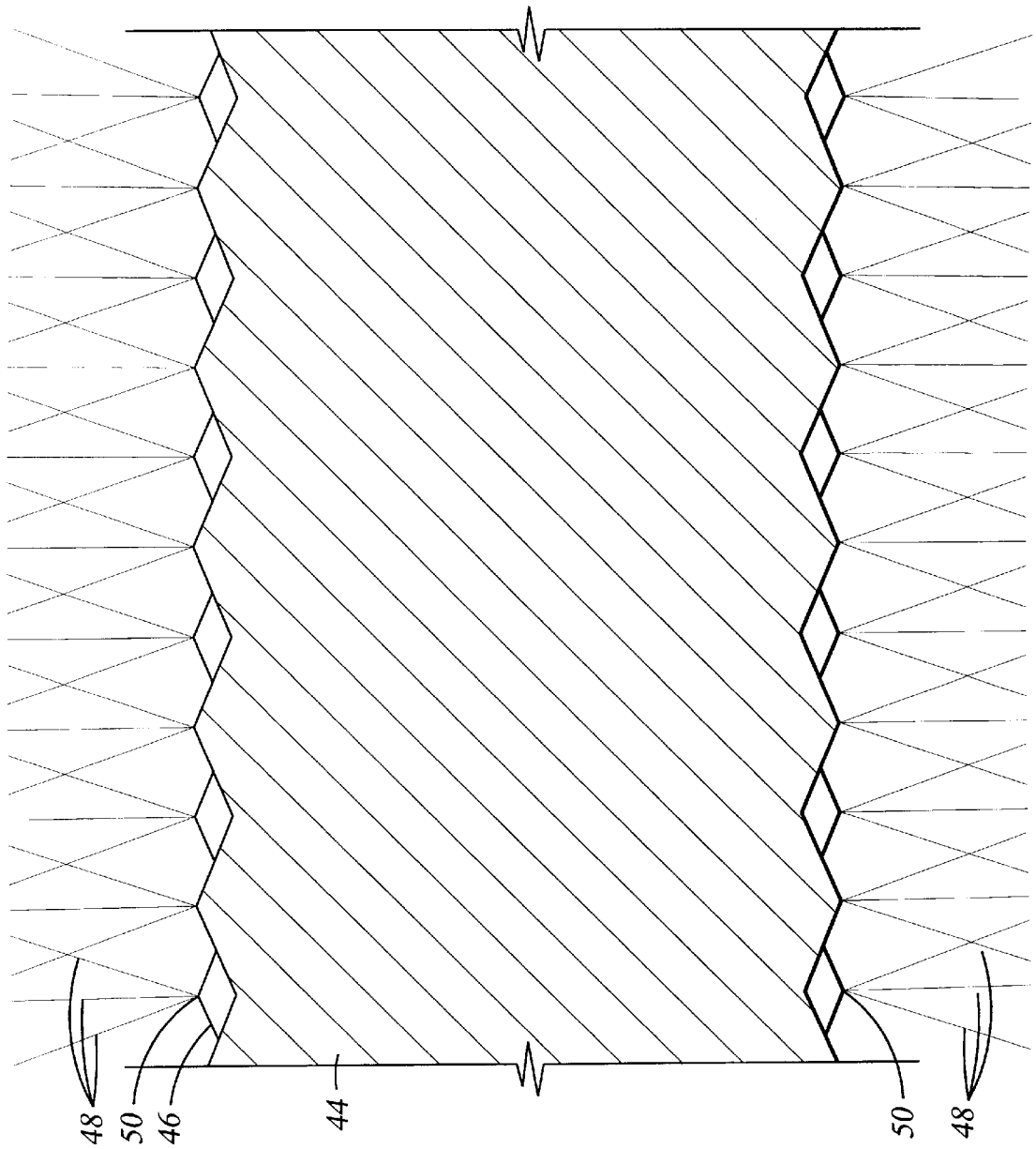
FIG. 5 is a sectional view of a portion of the coil of FIG. 4 showing the electric field lines adjacent the knurled surface.

Referring now to FIGS. 3, 4 and 5, a section 44 of the outer surface of a prior art RF coil used in an IMP process is shown. The coil shown in these figures has a knurled or roughened surface 46. At any instant in time as RF power is applied to coil section 44, at least a short section of its outer surface is at an equipotential value. Electric field lines of equipotential 48 (shown in FIG. 5), therefore, become concentrated around any sharp spikes or pin points 50 as depicted.

It is apparent from FIG. 5 that the concentration of electric field lines around sharp points 50 can cause the temporary existence of these points of very high values of the electric field. Such high values of the electric field in the negative half cycle of the applied RF power can attract and even capture ionized metallic ions in the plasma region of the RF coil. Because of the reversal of field in the positive half cycle of RF power, these attracted and temporarily deposited ions can be neutralized by the capture of a free electron from the metal lattice of the RF coil material, thus forming a neutral metallic atom, or a flake of metallic particles as the process is repeated which can contaminate a substrate and/or the process.

Figure 6:
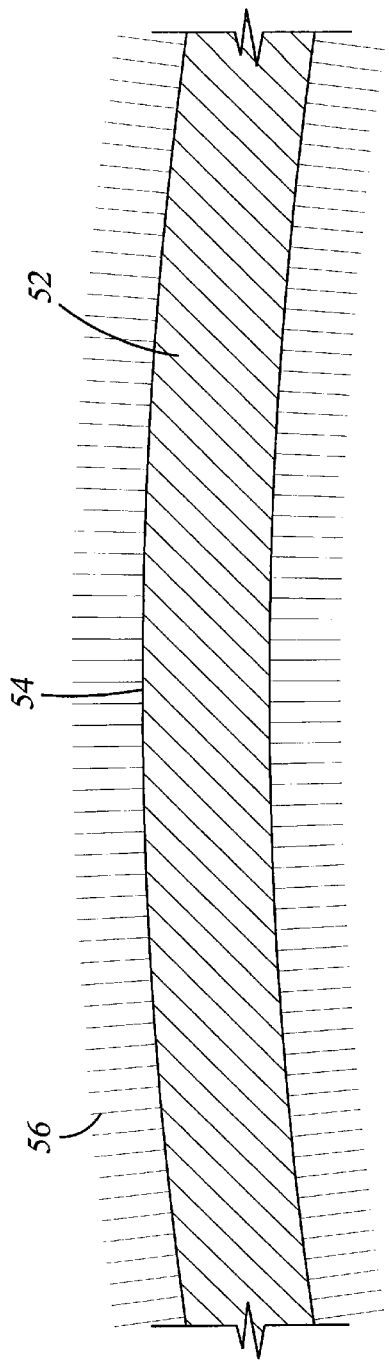
FIG. 6 is a schematic sectional view of a coil having a smooth surface.

In FIG. 6, a section 52 of the outer surface of a smooth RF coil of the present invention is shown. In the case of the coil section 52 of this figure, at any instant in time as the RF power is applied to coil section 52, at least a short section of the outer surface 54, which is very smooth in this case, is at an equipotential value. Thus, electric field lines 56 are evenly distributed across its surface.

Other approaches of the coil cooling system to adjust the temperature of the coil 40 shown in FIG. 2 at a low desired value could include the choice of high thermal conductivity materials such as AlN, copper, aluminum or the like in the coil support members. The coil support members suspend coil 40 in the chamber 20. Also, increasing the contact area of the coil support members and the coil 40 itself can assist in lowering oil operating temperatures. Any or all of these variations of the coil cooling system separately or in combination are deemed to be within the true spirit and scope of the present invention.

It should also be noted that while the embodiments described in detail contemplate a copper (Cu) coil for use in an IMP-Cu PVD deposition process, other metallic PVD deposition systems could offer improved in-film defect deposition properties if designed and operated according to the concepts of the invention. The PVD deposition of titanium, using a Ti coil, tantalum, using a Ta coil, or tungsten, using a W coil fall within the spirit and scope of the invention.

The foregoing descriptions may make other, alternative arrangements apparent to those of skill in the art. The aim of the appended claims is to cover all such changes and modifications as fall within the true spirit and scope of the invention.

What is claimed is:

1. A plasma enhanced physical vapor deposition system, comprising:
    a) a vacuum chamber, comprising:
        i) a sputtering target;
        ii) a substrate support member spaced apart from the target; and
        iii) at least one background gas supply and a vacuum pumping system that maintains a background gas at a predetermined pressure in the vacuum chamber;
    b) a generally helical coil mounted in a space between the target and the substrate support member, the coil having a polished exterior surface and having its helix axis at approximately right angles to the surface of the target and the substrate support; and
    c) a coil cooling system that adjusts a temperature of the coil.

2. The system of claim 1, wherein the exterior surface of the coil is a mechanically polished surface.

3. The system of claim 1, wherein the exterior surface of the coil is a chemically polished surface.

4. The system of claim 1, wherein the coil cooling system comprises a source of RF power connected to the coil and a controller that controls a duty cycle of the source of RF power.

5. The system of claim 1 wherein the coil cooling system comprises a cooling fluid that flows through an interior space of the coil.

6. The system of claim 1 and further comprising a plurality of coil support members formed of a high thermal conductivity material, the support members supporting the coil.

7. The system of claim 6 wherein the high thermal conductivity material is chosen from the group consisting of AlN, Cu and Al.

8. The system of claim 7 wherein the coil and the coil support members are formed of the same material and a contact area between the coil and the coil support members is greater than a minimum area required to support the coil by the coil support members.

9. An improved method for plasma enhanced physical vapor deposition comprising:
    a) depositing a film on a substrate utilizing a vacuum chamber comprising a coil mounted in a space between a target and a substrate supported by a substrate support member, the coil having a polished exterior surface and having its helix axis at approximately right angles to the surface of the target and the substrate support member; and
    b) cooling the coil.

10. The method of claim 9, further comprising mechanically polishing a coil surface.

11. The method of claim 9, further comprising chemically polishing a coil surface.

12. The method of claim 9, further comprising cooling the coil by controlling a duty cycle of a source of RF power coupled to the coil.

13. The method of claim 9, further comprising flowing fluid through an interior space of the coil.

14. The method of claim 9, further comprising supporting the coil with coil support members through a contact area greater than a minimum area required to support the coil with the coil support members.

\* \* \* \* \*